United States Patent
Huynh

(10) Patent No.: US 9,960,767 B2
(45) Date of Patent: May 1, 2018

(54) PROXIMITY DETECTOR

(71) Applicant: Valeo Systemes Thermiques, Le Mesnil Saint Denis (FR)

(72) Inventor: Tan Duc Huynh, Neuilly sur Marne (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 4 days.

(21) Appl. No.: 15/102,484

(22) PCT Filed: Dec. 12, 2014

(86) PCT No.: PCT/FR2014/000278
§ 371 (c)(1),
(2) Date: Jun. 7, 2016

(87) PCT Pub. No.: WO2015/086926
PCT Pub. Date: Jun. 18, 2015

(65) Prior Publication Data
US 2016/0322970 A1    Nov. 3, 2016

(30) Foreign Application Priority Data
Dec. 13, 2013 (FR) ...................... 13 02933

(51) Int. Cl.
*H03K 17/96* (2006.01)
(52) U.S. Cl.
CPC . *H03K 17/962* (2013.01); *H03K 2217/96076* (2013.01)

(58) Field of Classification Search
None
See application file for complete search history.

(56) References Cited

U.S. PATENT DOCUMENTS

| 5,075,632 A | * | 12/1991 | Payne | ........... | H03K 17/955 327/517 |
| 8,947,305 B2 | * | 2/2015 | Amm | ........... | H01Q 1/243 343/702 |
| 2007/0103451 A1 | | 5/2007 | Heimann et al. | | |

(Continued)

FOREIGN PATENT DOCUMENTS

| EP | 0 688 102 A1 | 12/1995 |
| EP | 2 209 212 A1 | 7/2010 |

(Continued)

OTHER PUBLICATIONS

International Search Report issued in PCT/FR2014/000278 dated Mar. 11, 2015 (3 pages).

(Continued)

*Primary Examiner* — Lincoln Donovan
*Assistant Examiner* — Khareem E Almo
(74) *Attorney, Agent, or Firm* — Osha Liang LLP

(57) ABSTRACT

According to one aspect, the invention relates to a proximity detector (10) of a motor vehicle device (Eq), the proximity detector (10) comprising:—a detection antenna (1) generating a detection signal when a user (U) is in the proximity of said device (Eq);—a printed circuit (2) processing the detection signal in order to command an action of said device (Eq);—and a conducting rod (3) for electrical connection of the detection antenna (1) to the printed circuit (2).

13 Claims, 3 Drawing Sheets

(56) References Cited

U.S. PATENT DOCUMENTS

| | | | | |
|---|---|---|---|---|
| 2010/0156676 A1* | 6/2010 | Mooring | ............... | G06F 3/017 |
| | | | | 341/20 |
| 2011/0041409 A1 | 2/2011 | Newman et al. | | |
| 2016/0322970 A1* | 11/2016 | Huynh | ............... | H03K 17/962 |
| 2017/0115825 A1* | 4/2017 | Eriksson | ............... | G06F 3/0421 |

FOREIGN PATENT DOCUMENTS

| | | |
|---|---|---|
| EP | 2 251 762 A2 | 11/2010 |
| FR | 2 704 332 A1 | 10/1994 |
| FR | 2 944 351 A1 | 10/2010 |
| GB | 2 352 297 A | 1/2001 |
| WO | 2013/098035 A1 | 7/2013 |

OTHER PUBLICATIONS

Written Opinion of the International Searching Authority issued in PCT/FR2014/000278 dated Mar. 11, 2015 (7 pages).

\* cited by examiner

PROXIMITY DETECTOR

TECHNICAL FIELD OF THE INVENTION

The technical field of the invention is that of human-machine interfaces (HMI). The present invention relates to a proximity detector, in particular a proximity detector for a device for an automotive vehicle.

TECHNOLOGICAL BACKGROUND OF THE INVENTION

A human-machine interface (HMI) is a tool allowing a human user to communicate with a machine and to control it. Human-machine interfaces may be, for example, of the following types:
 a screen, for example an LCD (liquid crystal display) screen of TFT (thin-film transistor) type;
 a control button;
 a lighting system, such as e.g. an interior light;
 a lever, for example a gearshift.

In order to allow and/or to facilitate the use of such interfaces, it is known practice to combine them with a proximity detector. A proximity detector may in particular control:
 the wake-up of the HMI;
 the display of information on the HMI in the case in which the HMI is a screen;
 the lighting or the backlighting of the HMI.

The proximity detector typically comprises a detection antenna and a printed circuit board which are electrically connected. The detection antenna is placed behind a surface element of a human-machine interface. The surface element is the part of the interface that is closest to the human user: it is, for example, a remote control facade in the case of a control button, or a gearshift knob in the case of a gearshift. The detection antenna may, for example, be a capacitive film fixed under the surface element. It is known practice to electrically connect the detection antenna and the printed circuit board by means of a flexible connector, such as a flat cable. This electrical connection solution can prove to be restrictive and costly, however.

SUMMARY OF THE INVENTION

The invention offers a solution to the aforementioned problems, by proposing a simple electrical connection that in particular allows the cost of fabricating a proximity detector to be reduced, in particular a proximity detector for a device for an automotive vehicle.

The invention therefore relates to, according to one aspect, a proximity detector for a device for an automotive vehicle, comprising:
 a detection antenna that generates a detection signal when a user is present in the proximity of said device;
 a printed circuit board that processes the detection signal for controlling an action on said device;
 a conductive rod for electrically connecting the detection antenna to the printed circuit board.

In the present description, the term "rod" is used without presupposing a particular type of cross section for said rod. The conductive rod may therefore, for example, be of circular, square or rectangular cross section.

By virtue of the invention, the electrical connection between the detection antenna and the printed circuit board is ensured via the conductive rod, which is a simple and inexpensive element, in particular with respect to a connector of ribbon cable type.

Aside from the features that were just mentioned in the preceding paragraph, the proximity detector according to one aspect of the invention may have one or more complementary features from among the following, considered individually or according to any of the technically possible combinations:
 The conductive rod is flexible and has a memory capacity. Alternatively, the conductive rod is rigid.
 The proximity detector advantageously comprises a conductive spring surrounding the conductive rod, the conductive spring having a first end and a second end that is opposite the first end, the first end being in contact with the detection antenna and the second end being in contact with the printed circuit board.
 The conductive rod has a first end and a second end, opposite the first end, and the first end of the conductive rod is in contact with the detection antenna and the second end of the conductive rod is in contact with the printed circuit board.
 Alternatively, the conductive rod has a central part that extends between a first end and a second end, and:
  the first end of the conductive rod is in contact with the detection antenna;
  the conductive rod passes through the printed circuit board via an adjustment opening in said printed circuit board.
 The central part of the conductive rod may additionally advantageously be in contact with the adjustment opening of the printed circuit board.
 As the detection antenna is located on a first side of the printed circuit board, an element for retaining the conductive rod is located on a second side, opposite the first side, of the printed circuit board, the retaining element being electrically connected to the printed circuit board.
 The conductive rod is soldered to the printed circuit board.
 The detection antenna is a capacitive antenna.
 The proximity detector comprises at least one element for mechanically supporting the detection antenna, said mechanical support element having a first end that is in contact with the detection antenna and a second end, opposite the first end, that is in contact with the printed circuit board.

The invention also relates to, according to another aspect, a device for an automotive vehicle comprising a proximity detector according to one aspect of the invention, the detection antenna being overmolded in a surface element of said device.

Aside from the features that were just mentioned in the preceding paragraph, the device for an automotive vehicle according to one aspect of the invention may have one or more complementary features from among the following, considered individually or according to any of the technically possible combinations:
 the device for an automotive vehicle comprises:
  a plurality of detection antennas, each detection antenna generating a detection signal when a user is present in the proximity of said device;
  at least one printed circuit board that processes a detection signal for controlling an action on said device;

a plurality of conductive rods, each conductive rod ensuring the electrical connection between one of said detection antennas and one of the printed circuit boards.

The device for an automotive vehicle belongs to the following list:
a screen;
a control button;
a lighting system;
a lever.

The invention and its various applications will be better understood upon reading the following description and examining the accompanying figures.

BRIEF DESCRIPTION OF THE FIGURES

The figures are presented by way of wholly non-limiting indication of the invention:

FIG. 1b shows a partial diagrammatic perspective view of the device of FIG. 1a;

DETAILED DESCRIPTION OF AT LEAST ONE EMBODIMENT OF THE INVENTION

Unless stated otherwise, the same element appearing in different figures has a single reference.

Figure 1A:
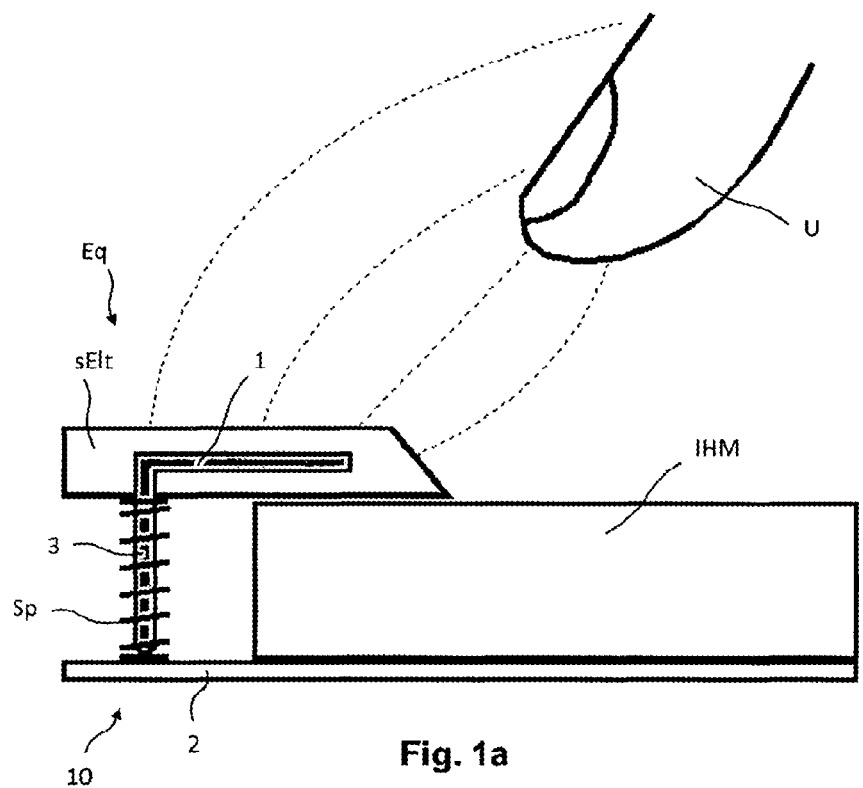
FIG. 1a shows a diagrammatic cross section of a device comprising a proximity detector according to a first embodiment of the invention.

FIG. 1a shows a cross-sectional view of a device Eq comprising:
a proximity detector 10 according to a first embodiment of the invention, allowing a user U or any other type of object in the proximity of the device Eq to be detected;
a surface element sElt;
a human-machine interface HMI.

The human-machine interface HMI may, for example, be a screen, a control button, a lighting system or a lever.

The proximity detector 10 according to the first embodiment of the invention comprises:
a detection antenna 1;
a printed circuit board 2;
a conductive rod 3 and a conductive spring Sp that electrically connect the detection antenna 1 to the printed circuit board 2. The conductive spring Sp is located around the conductive rod 3. The conductive spring Sp is guided by the conductive rod 3.

In the present description, the term "rod" is used without presupposing a particular type of cross section for said conductive rod 3. The conductive rod 3 may therefore, for example, be of circular, square or rectangular cross section.

The detection antenna 1 is advantageously overmolded in the surface element sElt, thereby conferring good resistance and a good mechanical hold thereon. The conductive rod 3 is advantageously an extension of the detection antenna 1. In this case, the detection antenna 1 and the conductive rod 3 form a one-piece assembly. Alternatively, the conductive rod 3 may be placed in contact with the detection antenna 1 and secured to the detection antenna 1, e.g. by soldering.

According to the first embodiment of the invention, the conductive spring Sp, guided by the conductive rod 3, advantageously allows the electrical connection between the detection antenna 1 and the printed circuit board 2 to be ensured while allowing a spacing tolerance between the detection antenna 1 and the printed circuit board. The conductive spring Sp has:
a first end that is in contact with and secured to the detection antenna 1;
a second end, opposite the first end, that is in contact with and secured to the printed circuit board 2.

The first end of the conductive spring Sp is, for example, soldered to the detection antenna 1, and the second end of the conductive spring Sp is, for example, soldered to the printed circuit board 2.

According to the first embodiment of the proximity detector 10, two cases for setting up the electrical connection between the detection antenna 1 and the printed circuit board 2 are differentiated according to the spacing between the detection antenna 1 and the printed circuit board 2:
according to a first case, the spacing between the detection antenna 1 and the printed circuit board 2 corresponds to the length of the conductive rod 3 and the conductive rod 3 is in contact with the printed circuit board 2. The electrical connection between the detection antenna 1 and the printed circuit board 2 is ensured both by the conductive rod 3 and by the conductive spring Sp.
according to a second case, the spacing between the detection antenna 1 and the printed circuit board 2 is greater than the length of the conductive rod 3: the conductive rod 3 is not in contact with the printed circuit board 2. The electrical connection between the detection antenna and the printed circuit board 2 is then ensured by the conductive spring Sp.

Figure 1B:
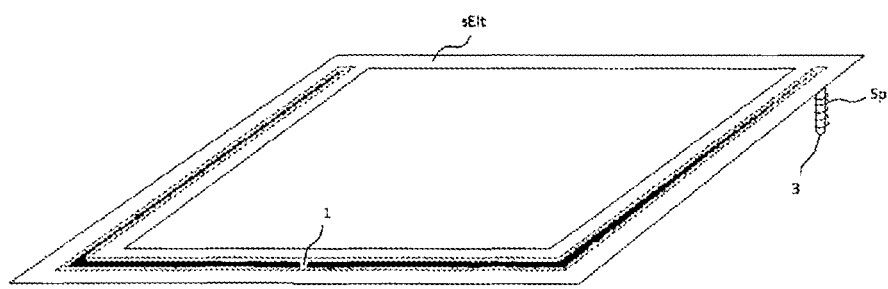

FIG. 1b shows a partial perspective view of the device Eq which was previously described in conjunction with FIG. 1a. The partial perspective view shows the surface element sElt, the detection antenna 1, the conductive rod 3 and the conductive spring Sp. In the particular example shown in FIG. 1b, the surface element sElt is a frame with four sides. The four-sided frame form of the surface element sElt is particularly suited to the case in which the human-machine interface HMI is a screen. The surface element sElt may have a large number of different forms, depending on the nature and the geometry of the human-machine interface HMI. In the particular example shown in FIG. 1b, the detection antenna 1, overmolded in the surface element sElt, extends along three sides of the surface element sElt. The detection antenna 1 may alternatively extend along one, two or all of the sides of the surface element sElt. It is also conceivable that the detection antenna 1 extends only over part of one side of the surface element sElt, or over part of two consecutive sides of the surface element sElt. The greater the surface area over which the detection antenna 1 extends, the more the sensitivity of the detection antenna increases. The more the dimensions and extent of the detection antenna 1 are limited, the more the cost of fabrication of the proximity detector 10 is brought under control. The conductive rod 3 and the conductive spring Sp are in contact with one end of the detection antenna 1. Alternatively, the conductive rod 3 and the conductive spring Sp may be in contact with any other part of the detection antenna 1. According to a first variant of the first embodiment, a plurality of detection antennas 1 may be implemented, with, for example, one detection antenna 1 per side of the surface element sElt. According to this first variant, a plurality of conductive rods 3 and conductive springs Sp are also implemented: a conductive rod 3 and a conductive spring Sp is used for each detection antenna. According to a second variant of the first embodiment, the proximity detector 10 may comprise at least one element for mechanically supporting the detection antenna 1, said mechanical support element having a first end that is in contact with the detection antenna 1 and a second end, opposite the first end, that is in contact with the printed circuit board 2. The proximity detector 10 may, for example, comprise a plurality of mechanical support elements that are regularly distributed along the detection antenna 1 and in particular placed at angles of the detection antenna 1.

Figure 2A:
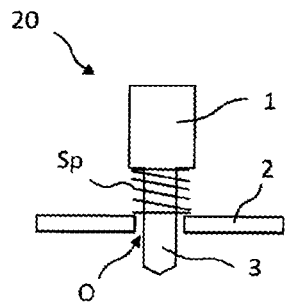
FIG. 2a shows a diagrammatic cross section of a proximity detector according to a second embodiment of the invention.

FIG. 2a illustrates a cross-sectional view of a proximity detector 20 according to a second embodiment of the invention. According to the second embodiment of the invention, the printed circuit board 2 comprises an adjustment opening O. The dimensions of the adjustment opening O are such that the conductive rod 3, which has a central part that extends between a first end and a second end, may pass through the printed circuit board 2 via the adjustment opening O. In the example illustrated in FIG. 2a, the conductive rod 3 is not in contact with the printed circuit board 2. The electrical connection between the detection antenna 1 and the printed circuit board 2 is therefore ensured by the conductive spring Sp, which is guided by the conductive rod 3. Alternatively, the dimensions of the adjustment opening O may be chosen in such a way that, when the conductive rod 3 passes through the adjustment opening O, the central part of the conductive rod 3 is in contact with the adjustment opening O. According to this alternative, when the conductive rod 3 passes through the adjustment opening O, the electrical connection between the detection antenna 1 and the printed circuit board 2 is ensured both by the central part 3 c of the conductive rod 3 and by the conductive spring Sp.

The proximity detector 20 according to the second embodiment of the invention advantageously offers a tolerance in the spacing between the detection antenna 1 and the printed circuit board 2, the tolerance not being limited by the length of the conductive rod 3. Specifically:

If the spacing between the detection antenna 1 and the printed circuit board 2 is larger than or equal to the length of the conductive rod 3, the conductive rod 3 does not pass through the adjustment opening O of the printed circuit board 2;

If, on the other hand, the spacing between the detection antenna 1 and the printed circuit board 2 is smaller than the length of the conductive rod 3, the conductive rod 3 passes through the adjustment opening O of the printed circuit board 2.

Figure 2B:
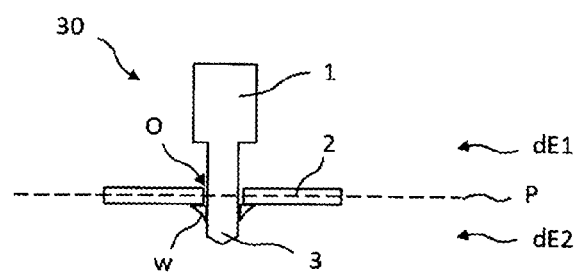
FIG. 2b shows a diagrammatic cross section of a proximity detector according to a third embodiment of the invention.

FIG. 2b illustrates a cross-sectional view of a proximity detector 30 according to a third embodiment of the invention. According to the third embodiment, the conductive rod 3 passes through the printed circuit board 2 via the adjustment opening O of the printed circuit board 2 and the conductive rod 3 is electrically connected to the printed circuit board 2 by a solder bead w. In the example shown in FIG. 2b, the printed circuit board 2 extends along a plane P that defines a first half-space dE1 and a second half-space dE2; the detection antenna 1 is located in the first half-space dE1 and the solder bead w is located in the second half-space dE2. It is also possible for the solder bead w to be located in the first half-space dE1, or, according to an alternative that is not illustrated, for the conductive rod 3 to be electrically connected to the printed circuit board 2 by first and second solder beads located on either side of the printed circuit board 2. According to the third embodiment, no spring is used, thereby advantageously allowing the proximity detector to be simplified. According to a first variant of the third embodiment, the printed circuit board 2 is able not to comprise an adjustment opening. In this case, the conductive rod 3 does not pass through the printed circuit board and is electrically connected to the printed circuit board 2 by a solder bead, which is located in the first half-space dE1. According to a second variant of the third embodiment, a flexible conductive rod that has a memory capacity is used. The conductive rod according to the second variant of the third embodiment may, for example, be:
  a conductive rod in the form of a "V" or in the form of an "upside-down V";
  a bent conductive rod.

The second variant of the third embodiment advantageously offers a mechanical tolerance in the spacing between the detection antenna 1 and the printed circuit board 2 while guaranteeing an electrical connection between the detection antenna 1 and the printed circuit board 2 by virtue of the conductive rod, which may be compressed or stretched to a greater or lesser degree. The first and second variants of the third embodiment are mutually compatible.

Figure 2C:
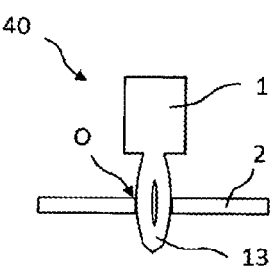
FIG. 2c shows a diagrammatic cross section of a proximity detector according to a fourth embodiment of the invention.

FIG. 2c illustrates a cross-sectional view of a proximity detector 40 according to a fourth embodiment of the invention. The proximity detector 40 according to the fourth embodiment of the invention comprises a conductive rod 13 of press-fit type. The press-fit type conductive rod has, for example, a plurality of curved conductive strips. Each curved conductive strip comprises a first end and a second end. The first ends of the curved conductive strips are gathered together to form a first end of the conductive rod 13. Likewise, the second ends of the curved conductive strips are gathered together to form a second end of the conductive rod 13. The plurality of curved conductive strips are arranged around an axis of revolution of the conductive rod 13, in such a way that the conductive rod 13 has a bulging central part. The cross section of the bulging central part is greater than the first and second ends. According to the fourth embodiment, the press-fit type geometry of the conductive rod 13 ensures that the bulging central part of the conductive rod 13 is in contact with the adjustment opening O of the printed circuit board 2, thereby guaranteeing the electrical connection of the detection antenna 1 with the printed circuit board 2.

Figure 2D:
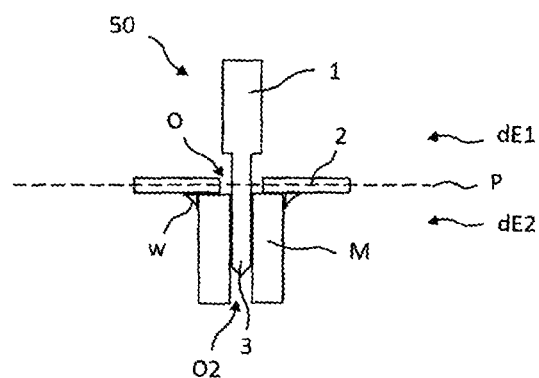
FIG. 2d shows a diagrammatic cross section of a proximity detector according to a fifth embodiment of the invention.

FIG. 2d illustrates a cross-sectional view of a proximity detector 50 according to a fifth embodiment of the invention. According to the fifth embodiment of the invention, the proximity detector 50 comprises an element M for retaining the conductive rod 3. The retaining element M is located in contact with the printed circuit board 2, in the second half-plane dE2 that was previously defined in conjunction with FIG. 2b. The retaining element M is conductive. A solder bead w secures the retaining element M to the printed circuit board 2 while reinforcing the electrical connection between the retaining element M and the printed circuit board 2. The retaining element M has a central opening O2. The dimensions of the central opening O2 are such that the conductive rod 3 may be inserted into the central opening O2 while being in contact with the central opening O2. Stated otherwise, the central opening O2 behaves as a female connector for the conductive rod 3, and the conductive rod 3 behaves as a male connector for the central opening O2. By virtue of the retaining element M, the conductive rod 3 benefits from a mechanical hold which limits the risks of breaking the conductive rod 3 and/or of bad contact between the detection antenna 1 and the printed circuit board 2.

Figure 3:
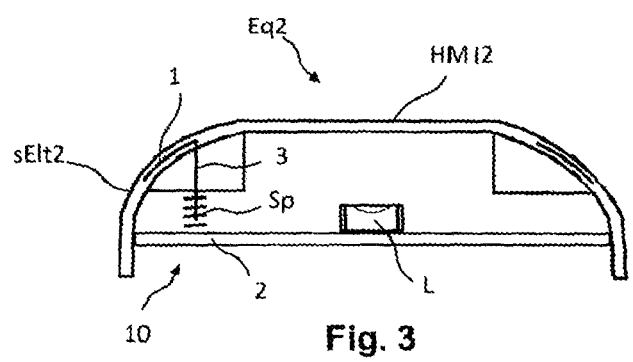
FIG. 3 shows a partial diagrammatic cross section of a second device comprising a proximity detector according to the first embodiment of the invention.

FIG. 3 illustrates a partial cross-sectional view of a second device Eq2, the second device Eq2 comprising:
- a human-machine interface HMI2 of "knob" type;
- a surface element sElt2 of the human-machine interface HMI2 of "knob" type;
- a lighting device L, e.g. an LED, allowing the backlighting of the human-machine interface HMI2 of "knob" type.

FIG. 3 shows another exemplary integration of the proximity detector 10 according to the first embodiment of the invention, previously described in conjunction with FIG. 1a. A typical exemplary manner of operation of the proximity detector 10 integrated in the second device Eq2 is the following:
- a user, initially remote from the second device Eq2, approaches the second device Eq2 and enters an area within which the proximity detector 10 operates;
- the detection antenna 1 of the proximity detector 10 generates a detection signal;
- the detection signal is transmitted to the printed circuit board 2 by virtue of the electrical connection, which is ensured in the particular case described here by the conductive rod 3 and the conductive spring Sp, between the detection antenna 1 and the printed circuit board 2;
- the printed circuit board 2 processes the detection signal and controls a backlighting of the human-machine interface HMI2 of "knob" type of the second device Eq2 via the lighting device L.

In the particular case described here, the backlighting controlled by the proximity detector 10 allows the second device Eq2 to be made more visible to the operator, in particular in a nighttime context, and the ergonomics of the second device Eq2 to be improved.

The invention claimed is:

1. A proximity detector for a device for an automotive vehicle, comprising:
   a detection antenna that generates a detection signal when a user is present in the proximity of said device;
   a printed circuit board that processes the detection signal for controlling an action on said device;
   a conductive rod for electrically connecting the detection antenna to the printed circuit board; and
   at least one element for mechanically supporting the detection antenna, said at least one mechanical support element having a first end that is in contact with the detection antenna and a second end, opposite the first end, that is in contact with the printed circuit board.

2. The proximity detector as claimed in claim 1, wherein the conductive rod is flexible and has a memory capacity.

3. The proximity detector as claimed in claim 1, wherein the conductive rod is rigid.

4. The proximity detector as claimed in claim 1, further comprising:
   a conductive spring surrounding the conductive rod, the conductive spring having a first end and a second end that is opposite the first end, the first end being in contact with the detection antenna and the second end being in contact with the printed circuit board.

5. The proximity detector as claimed in claim 1, in which the conductive rod has a first end and a second end, opposite the first end, wherein the first end of the conductive rod is in contact with the detection antenna and the second end of the conductive rod is in contact with the printed circuit board.

6. The proximity detector as claimed in claim 1, in which the conductive rod has a central part that extends between a first end and a second end, wherein the proximity detector is configured so that:
   the first end of the conductive rod is in contact with the detection antenna, and
   the conductive rod passes through the printed circuit board via an adjustment opening in said printed circuit board.

7. The proximity detector as claimed in claim 6, in which the detection antenna is located on a first side of the printed circuit board, the proximity detector being configured such that an element for retaining the conductive rod is located on a second side, opposite the first side, of the printed circuit board, and wherein the retaining element is electrically connected to the printed circuit board.

8. The proximity detector as claimed in claim 1, wherein the conductive rod is soldered to the printed circuit board.

9. The proximity detector as claimed in claim 1, wherein the detection antenna is a capacitive antenna.

10. A device for an automotive vehicle, comprising a proximity detector as claimed in claim 1, wherein the detection antenna is overmolded in a surface element of said device.

11. A device for an automotive vehicle, comprising:
    a plurality of detection antennas as claimed in claim 1, each detection antenna generating a detection signal when a user is present in the proximity of said device;
    at least one printed circuit board that processes a detection signal for controlling an action on said device; and
    a plurality of conductive rods, each conductive rod ensuring the electrical connection between one of said detection antennas and one of the printed circuit boards.

12. A device for an automotive vehicle as claimed in claim 10, wherein the device is one selected from the group consisting of:
    a screen;
    a control button;
    a lighting system; and
    a lever.

13. A proximity detector for a device for an automotive vehicle, comprising:
    a detection antenna that generates a detection signal when a user is present in the proximity of said device;
    a printed circuit board that processes the detection signal for controlling an action on said device; and
    a conductive rod for electrically connecting the detection antenna to the printed circuit board,
    wherein a conductive spring surrounds the conductive rod and the conductive spring has a first end that is in contact with the detection antenna, and a second end, opposite the first end, that is in contact with the printed circuit board.

* * * * *